ANALOG-TO-DIGITAL CONVERTER

Filed Feb. 4, 1960 2 Sheets-Sheet 1

INVENTOR.
WILLIAM BROOKS
BY George C. Sullivan
Agent

ANALOG-TO-DIGITAL CONVERTER

Filed Feb. 4, 1960

2 Sheets-Sheet 2

INVENTOR.
WILLIAM BROOKS
BY George C. Sullivan
Agent 3,170,153
ANALOG-TO-DIGITAL CONVERTER
William Brooks, Sunnyvale, Calif., assignor to Lockheed Aircraft Corporation, Burbank, Calif.
Filed Feb. 4, 1960, Ser. No. 7,739
5 Claims. (Cl. 340—347)

This invention relates generally to electronic data conversion systems, and more particularly to an improved type of analog-to-digital converter.

An analog-to-digital converter system is well known to be a system in which an analog signal is sampled and converted to a plurality of pulses which serve as a digital representation of the instantaneous amplitude of the analog signal. One of the major drawbacks of presently known analog-to-digital conversion systems is that considerable circuit complexity is required to perform this analog-to-digital conversion function, particularly where any degree of accuracy is desired. Also, presently known systems are relatively critical and must be carefully adjusted in order to achieve reliable performance. Still further, presently known analog-to-digital conversion systems lack versatility and usually require major circuit changes even for relatively minor changes in system operation.

Accordingly, it is the broad object of this invention to provide an improved analog-to-digital converter which is relatively simple and has considerable versatility.

Another object of this invention is to provide an improved method for digitizing an analog signal.

The present invention basically involves a new approach to analog-to-digital conversion, in which the techniques of capacitor storage and signal recirculation are employed in a dual channel arrangement which permits high accuracy to be obtained with a minimum of necessary components, and also permits both the number of bits of the digital code and the full scale reading of the system to be conveniently varied.

The specific nature of the invention, as well as other objects, uses and advantages thereof, will clearly appear from the following description and from the accompanying drawing in which.

Figure 1:
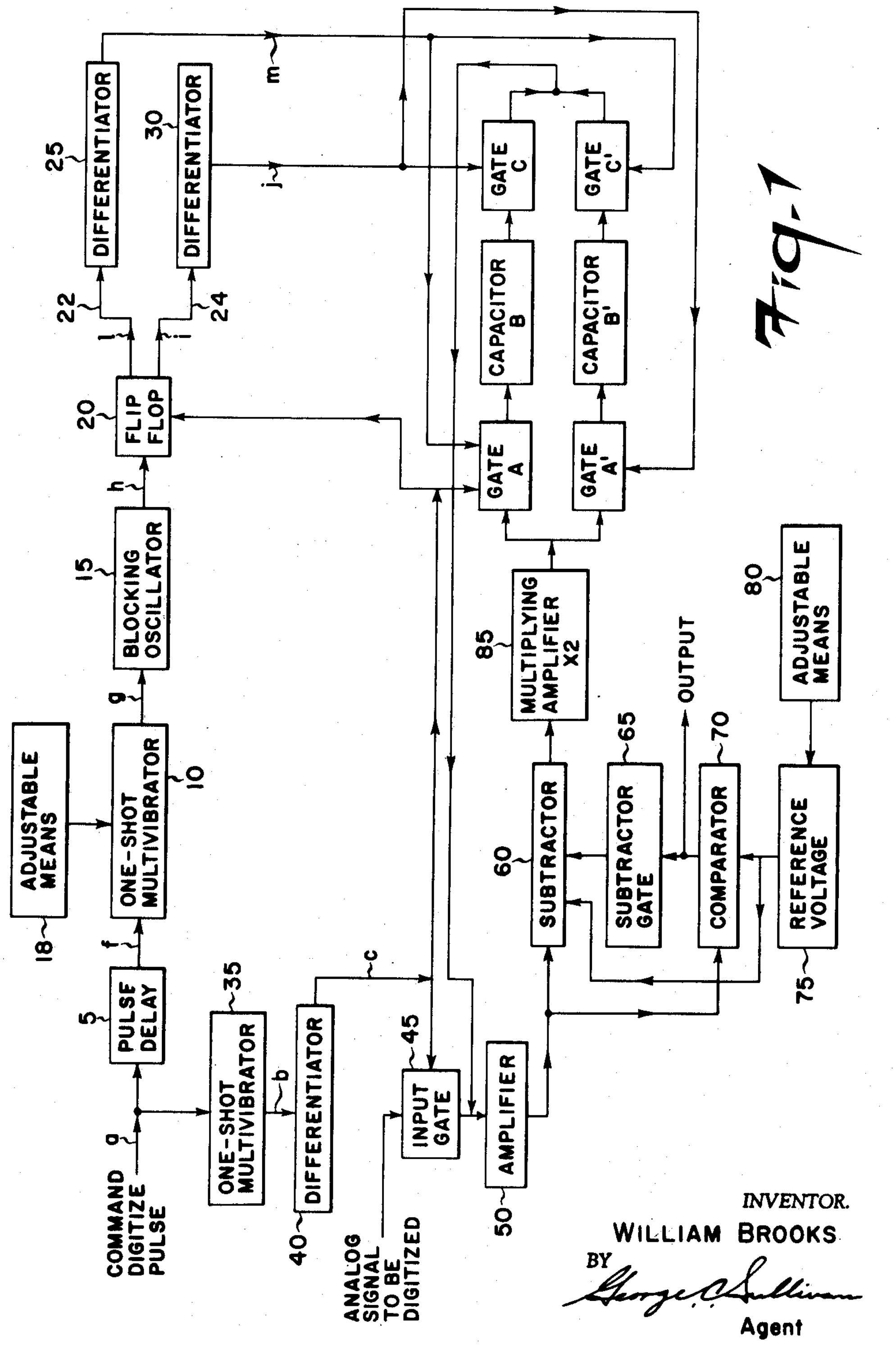
FIG. 1 is a block diagram of an embodiment of an analog-to-digital conversion system in accordance with the invention.

In FIG. 1, the analog signal to be digitized is applied to an input gate 45 which is adapted to be opened for a predetermined time by a suitable trigger signal. When the input gate 45 is open the analog signal passes to a buffer amplifier 50 whose output is fed to both a subtractor 60 and a comparator 70 as shown. The comparator 70 compares the voltage applied at its input from the amplifier 50 with a reference voltage 75 also applied to the comparator 70, and then produces an output pulse whenever the input to the comparator 70 is greater than the reference voltage 75. Adjustable means 80 connected to the reference voltage 75 are provided to permit adjustment thereof.

The output pulse produced by the comparator 70 when its input is greater than the reference voltage 75 is then fed to a subtractor gate 65 causing triggering thereof. The subtractor gate 65 applies a gating pulse of predetermined duration to the subtractor 60. The subtractor 60 is constructed and arranged so that when the gating pulse from the subtractor gate 65 is applied thereto, the subtractor 60 subtracts the reference voltage 75 from the input applied to the subtractor 60 from the amplifier 50. When the gating pulse from the subtractor gate 65 is absent, the subtractor 60 passes the output from the amplifier 50 substantially without any change.

The output of the subtractor 60 is fed to a multiplying amplifier 85 which multiplies the input signal thereto by a predetermined number, which is indicated as 2 in FIG. 1. The output of the multiplying amplifier feeds two channels. One channel comprises gate A, capacitor B and gate C, in that order, while the other channel comprises gate A′, capacitor B′ and gate C′, in that order. The output from the multiplying amplifier 85 is fed to the inputs of both gates A and A′. Each of these gates A and A′ are adapted to be opened for a predetermined amount of time by a suitable trigger pulse applied thereto, only one of these gates being open at a time. When either of the gates A or A′ are open, they permit the multiplied output from the multiplying amplifier 85 to pass therethrough. The capacitors B and B′ charge up to the magnitude of the output signal of the multiplying amplifier when its respective gate A or A′ is open.

The gates C and C′ are connected to the outputs of the capacitors B and B′ and each is also adapted to be opened for a predetermined amount of time by a suitable trigger pulse. Like the gates A and A′, only one of the gates C or C′ is open at a time, the gate C being triggered along with the gate A′, and the gate C′ being triggered along with the gate A. When the gates A, A′, C and C′ are closed they appear as very high impedances to their respective capacitor B or B′, so that the voltage to which it has charged will be retained thereon. When either the gate C or C′ is triggered open, the voltage on the respective capacitor B or B′ passes to the input of the amplifier 50 as shown in FIG. 1.

The above described elements of the system of FIG. 1 are the ones through which the analog signal is circulated to obtain analog-to-digital conversion. The remaining elements of FIG. 1, which will now be described, provide the control and cooperation required for system operation. Operation of the system of FIG. 1 is initiated by applying a command digitize pulse to a pulse delay 5 and a one-shot multivibrator 35. Considering first the effect of applying the command digitize pulse to the one-shot multivibrator 35, it will be seen that the output of the one-shot multivibrator 35 is fed to a differentiator 40 which differentiates the output pulse of the multivibrator 35 producing relatively short duration positive and negative output pulses. The output of the differentiator 40 is then fed to the input gate 45, the gate A and the flip-flop 20. The flip-flop 20 is made sensitive to the positive pulse output of the differentiator 40, which occurs first, while the input gate 45 and gate A are made sensitive to the negative output pulse of the differentiator 40 which occurs a predetermined time after the positive output pulse, as determined by the time constant of the one-shot multivibrator 35. The positive output pulse from the differentiator 40 is applied to the flip-flop 20 in such a way that it causes the flip-flop to end up in a predetermined state, regardless of the state it was in prior to receipt of this pulse.

Considering now the effect of applying the command digitize pulse to the pulse delay 5 it will be understood that the pulse delay 5 delays the command digitize pulse by a predetermined amount and then feeds it to a one-shot multivibrator 10 which produces an output pulse which energizes the blocking oscillator 15, causing it to oscillate for a predetermined amount of time, thereby generating a predetermined number of pulses. The pulses generated by the blocking oscillator 15 are then fed to the flip-flop 20 to alternately switch the states thereof in a conventional manner, the flip-flop 20 having been set in a desired initial state by the positive output pulse from the differentiator 40. Since the output of the one-shot multivibrator 10 energizes the blocking oscillator 15, its duration determines the number of pulses that the blocking oscillator 15 will generate and apply to the flip-flop 20. An adjustable means 18 is suitably connected to the one-shot multivibrator 10 to vary the duration of its output pulse, so that the number of pulses generated by the blocking oscillator 15 can be set to any desired amount.

Trigger pulses for the gates A and C′, and A′ and C are obtained by differentiating each of the outputs 22 and 24 of the flip-flop by differentiators 25 and 30, respectively, the output of the differentiator 25 being fed to trigger the gates A and C′, and the output of the differentiator 30 being fed to trigger the gates A′ and C.

In the block diagram of FIG. 1, which illustrates an embodiment of an analog-to-digital conversion system in accordance with the invention, each of the elements constituting the system have been represented by a suitably titled block. Since each of the electronic devices represented by these blocks are well known in the art and can readily be provided in a variety of forms, further details will not be given. The present invention resides in the novel combination of well known electronic devices which produce an improved type of analog-to-digital conversion sytem and is not dependent upon the details of any of these devices. The description of these devices as so far given, along with the detailed explanation of the operation of the embodiment of FIG. 1 which will now be explained using the graphs of FIGS. 2 and 3, will be entirely sufficient to permit those skilled in the art to readily provide any of the necessary electronic devices in order to practice this invention. In fact, as will no doubt be realized by those skilled in the art, the electronic devices represented in block form in FIG. 1 are of the type which lend themselves to transistor circuitry, thereby making it possible to construct the entire system in transistor form.

Figures 2, 3:
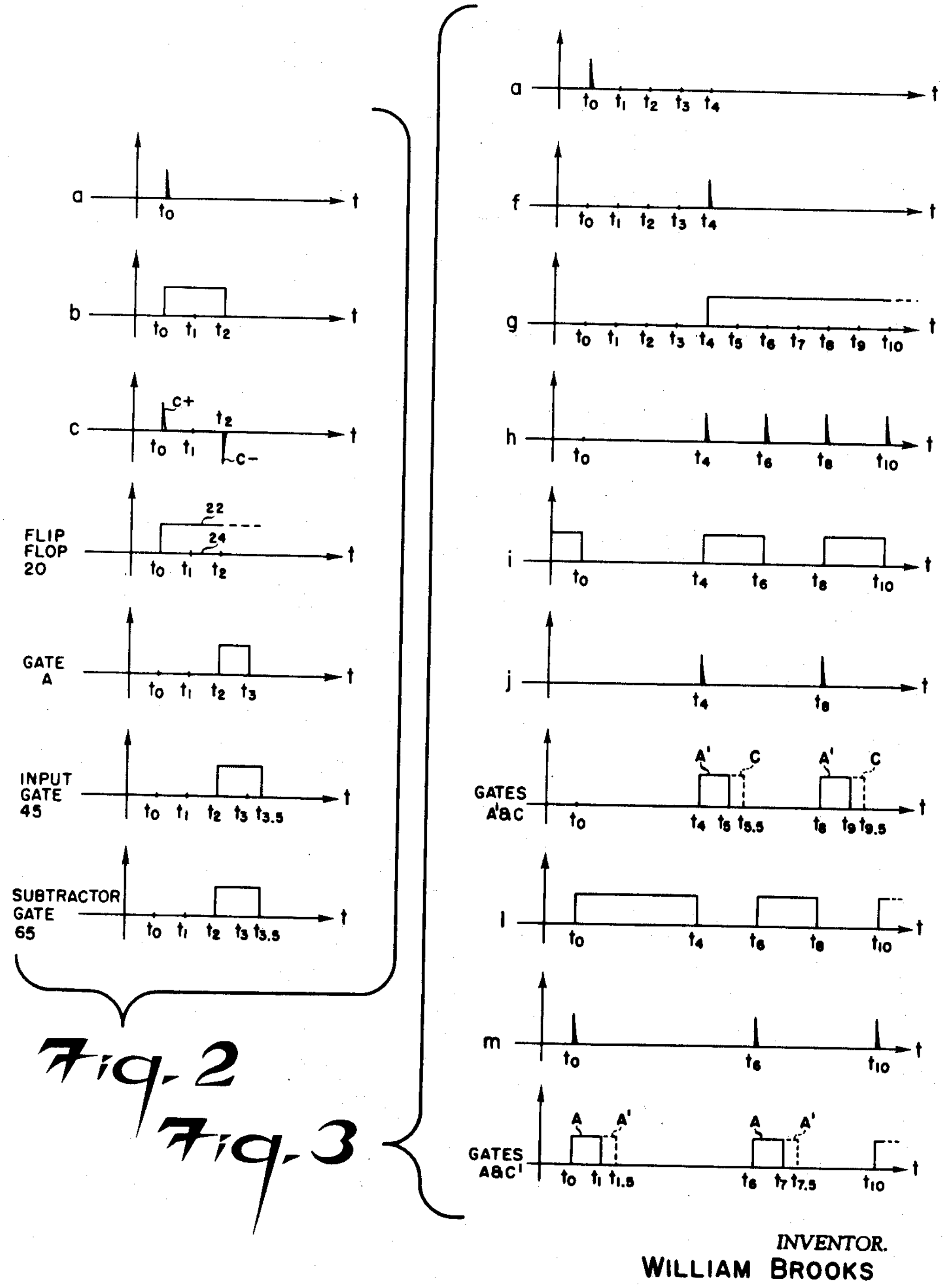
FIGS. 2 and 3 are graphs showing the signals appearing at various points and the characteristics of the gates in the embodiment of FIG. 1.

In FIG. 2 and 3, graphs are shown representing the signals appearing at various places in the circuit of FIG. 1 and the characteristics of the gating circuits thereof. The graphs in these FIGS. 2 and 3 are designated with letters which correspond to the points in the circuit of FIG. 1 which are indicated by the same letters. Those graphs of FIGS. 2 and 3 which illustrate the characteristics of the various gates of FIG. 1 are designated with identifying titles.

Using the graphs of FIGS. 2 and 3, the operation of the embodiment of FIG. 1 will now be described in detail. With the analog signal to be digitized applied to the input gate 45 as shown, analog-to-digital conversion is now initiated by applying a command digitize pulse to the pulse delay 5 and the one-shot multivibrator 35. A typical command digitize pulse *a* is illustrated in FIG. 2. For the purposes of this detailed explanation, it will be assumed that this command digitize pulse *a* is applied at time $t_0$. The graphs of FIG. 2 show what happens when the command digitize pulse *a* is applied to the one-shot multivibrator 35. The one-shot multivibrator 35 produces a rectangular output pulse as illustrated in the graph *b* in FIG. 2 having a duration covering the time $t_0$ to the time $t_2$. This pulse *b* is then differentiated by the differentiator 40 to produce the positive and negative output pulses $c+$ and $c-$ shown in graph *c* of FIG. 2. As mentioned previously, the positive pulse $c+$ is fed to the flip-flop 20 in such a way that regardless of which state the flip-flop 20 was previously in, the flip-flop 20 ends up in a predetermined state. For this explanation it will be assumed that this predetermined state is the one at which the output 22 of the flip-flop 20 is at a relatively high voltage, while its output 24 is substantially at zero. This is illustrated in the graph of the flip-flop 20 in FIG. 2 in which it has been assumed that initially the flip-flop 20 is not in the predetermined state desired. The application of the positive output pulse $c+$ from the differentiator 40, therefore, causes it to switch into the desired predetermined state with its output 22 at a high voltage and its output 24 at substantially zero volts. This can readily be accomplished in a two-stage flip-flop 20, such as by feeding the pulse $c+$ to only one of the two stages.

The input gate 45 and the gate A are adapted to be triggered by the negative output pulse $c-$ from the differentiator 40 occurring at time $t_2$. The operation of the gate A and the input gate 45 are illustrated in the similarly designated graphs of FIG. 2. The output pulse of the one-shot multivibrator 35 illustrated as $t_0$–$t_2$ in graph *b* of FIG. 2 is made sufficiently long so that when the gate A and the input gate 45 are triggered at time $t_2$, any effect caused by switching the flip-flop 20 to the desired state shown in the graph of FIG. 2 will have died out. In particular, as will hereinafter be described in connection with the graphs of FIG. 3, the time $t_0$–$t_2$ must be sufficiently long so that if the flip-flop 20 must be switched in order to get it into the state illustrated in the flip-flop graph of FIG. 2, the gates A and C′ which will thereby be triggered open will have closed before the time $t_2$. This is necessary in order to prevent interaction as will later become evident.

It will be understood that when the input gate 45 is turned on for the predetermined time $t_2$–$t_3$ shown in FIG. 2, the analog signal to be digitized will pass therethrough to the amplifier 50 and then be fed to both the subtractor 60 and the comparator 70. If the output of the amplifier 50 is greater than the reference voltage 75, the comparator 70 produces an output pulse which turns on the subtractor gate 65, as shown in the graph of FIG. 2. The time between the opening of the input gate 45 and the opening of the subtractor gate is very small so that the subtractor gate can also be considered as opening at the time $t_2$. Opening the subtractor gate 65 causes the subtractor 60 to subtract the reference voltage 75 from the voltage at the output of the amplifier 50, the difference between the two being fed to the multiplying amplifier 85, which will be assumed to give a multiplication of 2. If the output of the amplifier 50 is less than the reference voltage 75, then the comparator 70 produces no output pulse, the subtractor gate 65 remains off and the subtractor 60 passes the voltage at the output of the amplifier 50 to the multiplying amplifier 85 with substantially no change.

As shown in the graphs of FIG. 2, the gate A, the input gate 45 and the subtractor gate 65 are all simultaneously open after $t_2$ so that the output of the multiplying amplifier 85 passes through the gate A to charge the capacitor B to the voltage thereof. The gate A then closes first at $t_3$ followed shortly thereafter by the input gate 45 and the subtractor gate 65 at $t_{3.5}$. Thus, the capacitor B remains charged at a voltage corresponding to the voltage output of the multiplying amplifier 85, which is twice the voltage applied to the multiplying amplifier 85 by the subtractor 60.

For reliable operation, the gates A, 45 and 46 should be properly coordinated. This is accomplished in the previous operative description by causing all of these gates to be turned on at the time $t_2$ as shown in FIG. 2. The gate A and the input gate 45 are turned on at the time $t_2$ by the negative output pulse $c-$ from the differentiator 40, while the subtractor gate 65 is turned on substantially at $t_2$ when the output signal from the amplifier 50 is greater than the reference voltage 75. The times at which the gates A, 45 and 65 are opened, however, are not critical, the only requirement being that the input gate be turned on at a sufficient time later than $t_0$ so that effects of switching the flip-flop 20 to the desired state do not effect the resultant operation of the system. The closing times of the gates A, 45 and 65, on the other hand, are of some consequence, and should be chosen so that the gates A, 45 and 65 are all on for a time sufficient for the capacitor B to charge to the voltage appearing at the output of the multiplying amplifier 85. Then, the gate A should close prior to the closing of both the gates 45 and 65 so as to effectively isolate the capacitor B at the voltage to which it has been changed, thereby assuring that it will remain at this voltage. The input gate 45 and the subtractor gate 65 may then be turned off at any convenient time after the gate A has closed. In FIG. 2, this is illustrated by closing the gate A at time $t_3$, while the input gate 45 and the subtractor gate 65 are both closed at the time $t_{3.5}$. Obviously, the input gate 45 and the subtractor gate 65 should not remain on long enough to interfere with the action of the system which follows and which will now be described in connection with the graphs of FIG. 3.

In FIG. 3, the graph *a* again represents the command digitize pulse appearing at time $t_0$. The graph *f* illustrates the output pulse obtained from the pulse delay 5 which introduces the delay $t_0$–$t_4$. The delayed pulse is then fed to the one-shot multivibrator 10 which generates a rectangular output pulse of predetermined duration as indicated by the graph *g* in FIG. 3. As shown in graph *g*, the pulse generated by the one-shot multivibrator 10 is of considerable duration as compared to the other times involved in the system. As was explained previously, the pulse output of the one-shot multivibrator 10 indicated at *g* applies energizing power to the blocking oscillator 15 causing it to oscillate and generate output pulses at a rate determined by the time constants thereof. The output pulses generated by the blocking oscillator 15 are shown by graph *h* and are seen to occur at $t_4$, $t_6$, $t_8$ and $t_{10}$. The blocking oscillator will continue to generate output pulses as long as energization power is applied to the blocking oscillator 50 by means of the output pulse *g* of the one-shot multivibrator 10. For convenience, only four pulses of the blocking oscillator 15 are shown in the graph *h* of FIG. 3.

The blocking oscillator pulses *h* are then fed to the flip-flop 20 which switches from one state to the other state in response to each of these pulses *h* as shown in graphs *i* and *l* in FIG. 3. The voltage at the output 24 of the flip-flop 20 is shown by the graph *i*, while the voltage at the output 22 is shown by the graph *l*. As was assumed in the flip-flop 20 graph of FIG. 2, it will be assumed that the flip-flop 20 is initially not in the state desired. Then, at $t_0$ the positive output pulse from the differentiator 40 fed to the flip-flop 20 acts to switch the flip-flop to the desired initial state: that is, at $t_0$ the voltage at the output 24 shown by graph *i* is switched from a high value to substantially zero while at $t_0$ the voltage at the output 22 corresponding to graph *l* is switched from substantially zero to a relatively high voltage. This desired initial state of the flip-flop 20 is maintained until the first blocking oscillator pulse occuring at the time $t_4$ is fed to the flip-flop 20, whereupon the flip-flop 20 switches to its other state as shown in graphs *i* and *l* at $t_4$. At time $t_6$ when the second pulse of the blocking oscillator 15 is received by the flip-flop 20, the flip-flop 20 again switches and this switching operation continues for each pulse of the blocking oscillator 15 as shown by graphs *i* and *l*.

The graph *j* in FIG. 3 shows the output of the differentiator 30 to which the output 24 of the flip-flop 20 is fed, while the graph *m* shows the output of the differentiator 25 to which the output 22 of the flip-flop 20 is fed. It should be noted in graph *m* that an output pulse is obtained at $t_0$ as a result of the flip-flop 20 being switched to the desired initial state. The differentiators 25 and 30 differ from the differentiator 40 in that these differentiators 25 and 30 incorporate a suitably poled diode in the output which shorts out the negative pulses so that they do not appear in the graphs *j* and *m*.

The explanation of the operation of the embodiment of FIG. 1 may now be continued with the aid of the graphs of FIG. 3. As was explained previously, the analog signal to be digitized is amplified by the amplifier 50 and then either passed directly to the multiplying amplifier 85 or has the reference voltages 75 subtracted from it, whereupon it passes through the open gate A and is stored in the capacitor B. The first pulse of the blocking oscillator 15 shown at $t_4$ in graph *h* will then cause the flip-flop 20 to be switched from its initial position shown in the interval between $t_0$ and $t_4$ in graphs *i* and *l* to its other state, causing a pulse to be generated by the differentiator 30 at $t_4$ as shown in graph *j*. This occurs because as shown in graphs *i* and *l*, the output 22 of the flip-flop 20 falls at $t_4$ producing a negative pulse which is clipped by the diode in the output of the differentiator 25, so that no pulse appears at $t_4$ in graph *m*. On the other hand, the voltage at the output 24 rises to a relatively high positive value at $t_4$ as shown by the curve *i*, producing the positive pulse in graph *j* shown at $t_4$, which then triggers the gates C and A', causing them to open for a predetermined amount of time. The characteristics of these gates C and A' are shown in the graphs corresponding thereto in FIG. 3. The solid rectangle in these graphs represents the time duration during which the gate A' is open while the dotted rectangle C represents the additional time for which the gate C remains open after the gate A' is closed.

It will now be seen that when the appearance of the first blocking oscillator pulse at $t_4$ effectively opens the gate C, the voltage which was stored on the capacitor B passes to the input of the amplifier 50 where it is again amplified and fed to the subtractor 60 and the comparator 70. If the signal fed to the comparator 70 is still less than the reference voltage 75, it will pass essentially unchanged to the multiplying amplifier 85 where it is multiplied by 2. However, if the voltage is now greater than the reference voltage 75 (since it was multiplied by 2 by the multiplying amplifier 85 the first time around) the reference voltage 75 will be subtracted from this voltage at the output of the amplifier 50, causing the difference therebetween to be fed to the multiplying amplifier 85. This time the gate A is closed and the gate A' is open, causing this voltage now appearing at the output of the multiplying amplifier 85 to be stored in the capacitor B' when the gate A' closes. For the same reasons as were explained in connection with the graphs of FIG. 2, the gate A' closes before the gate C, with the same requirement being that the gates A' and C are simultaneously on for a sufficient time to cause the capacitor B' to charge up to the voltage at the output of the multiplying amplifier 85. Also, the input of the amplifier 50 is made sufficiently high so that the voltage on the capacitor B which is fed thereto through the gate C is substantially retained for a sufficient time to permit the capacitor B' to be charged to the new output of the multiplying amplifier 85.

When the second pulse of the blocking oscillator 15 now comes along, as indicated at $t_6$ in the graph *h* of FIG. 3, the gates A and C' are opened while the gates A' and C remain closed. The operation of the system is then the same as just described, except that this time the voltage stored on the capacitor B' passes through the gate C' and is fed to the input of the amplifier 50 to be recirculated through the system.

The operation just described for blocking oscillator pulses at $t_4$ and $t_6$ is repeated for blocking oscillator pulses at $t_8$ and $t_{10}$ as shown in the graphs of FIG. 3 and continues as long as there are pulses from the blocking oscillator 15. An output pulse is obtanied from the comparator 70 whenever the output of the amplifier 50 is greater than the reference voltage 75. Thus, at the output of the comparator 70 it is possible to observe whether or not a pulse is obtained when the input gate 45 is opened upon application of the command digitize pulse, or for any of the recirculations occurring in response to each blocking oscillator pulse. The total number of circulations which occur in the system upon application of the command digitize pulse is equal to the number of information bits provided by the system. It is evident that the number of bits provided by the system of FIG. 1 is 1 plus the number of blocking oscillator pulses generated. As will hereinafter be shown, the knowledge of whether or not an output pulse was obtained from the comparator 70 for each circulation or bit permits the magnitude of the analog signal to be determined with an accuray dependent upon the number of circulations or bits provided.

If the multiplying amplifier 85 is chosen to have a gain of 2 so as to provide a multiplication by 2, then the output information obtained from the comparator 70 will be a binary number corresponding to the magnitude of the analog signal where each bit corresponds to a digit of the binary number, the number of bits thereby determining the number of digits of the binary number. A digit corresponding to a bit at which a pulse was produced is designated as a "1," while a digit corresponding to a bit at which a pulse was not produced is designated as a "0."

In such a binary system where the multiplying amplifier 85 multiples by 2, and it is assumed that the gain of the amplifier 50 is 1, the full-scale reading would be equal to twice the value of the reference voltage 75. If the amplifier 50 has a gain different from 1, then the full-scale reading is twice the reference voltage divided by the gain of the amplifier 50. By changing the magnitude of the reference voltage 75, therefore, which is readily done by any suitable adjustable means as indicated at 80, the full-scale reading of the system is conveniently varied. Also, by adjusting the adjustable means 18, the duration of the pulse produced by the one-shot multivibrator 10 shown by graph *g* in FIG. 3 can be conveniently changed so that the blocking oscillator 15 may be caused to generate any desired number of pulses. The resultant number of bits of the binary number obtained at the output from the comparator 70 may then be made as large as is desired, the larger the number of blocking oscillator pulses used, the greater the accuracy with which the binary number will be able to represent the analog signal applied to the system.

It is to be understood that it is not necessary that the multiplying amplifier 85 provide a multiplication of 2, although this is preferable because the output pulses will then be in convenient binary form. The only requirement of the system is that the multiplying amplifier 85 provide some significant amount of multiplication. By so doing, the resultant digital output pulses obtained from the comparator 70 will then be in a form which will permit the magnitude of the analog signal to be determined therefrom with an accuracy dependent upon the number of bits used.

In order to clearly illustrate the operation of the invention, a specific illustrative example will now be presented for the embodiment of FIG. 1 operated as a binary system where the multiplying amplifier 85 provides a multiplication of 2. It will be assumed that a full-scale reading of 10 volts is desired. For convenience the amplifier 50 will be assumed to have a gain of 1. Since the full-scale voltage will then be equal to twice the reference voltage 75, the reference voltage 75 is chosen equal to 5 volts. Let it also be assumed that the one-shot multivibrator 10 provides an output pulse of sufficient duration so that the blocking oscillator provides seven oscillating pulses which when added to the command digitize pulse results in a total of eight bits for the system. Thus, at the output from the comparator 70 there are eight possible times at which an output pulse can be obtained. For any given analog signal applied to the system, therefore, eight bits of information are obtained at the output from the comparator 70, corresponding to an eight digit binary number. Those bits which do not produce a pulse will have their digit designated as "0," and those that do will have their digit designated as "1." An eight-digit binary number will then be obtained for each analog signal applied to the system, the value of this binary number giving the magnitude of the analog signal. From conventional binary number theory the general equation for the magnitude of an analog signal V applied to the system may now be written as follows:

$$V = R\sum_{n=1}^{n=8}\frac{1}{2^n}P_n$$

$$P_n = 0 \text{ or } 1$$

where *n* represents the number of the bit or digit of the binary number starting with the command digitize pulse, R is the full-scale reading of the system (equal to twice the reference voltage) and $P_n$ is either 0 or 1 depending upon whether or not the comparator 70 generated a pulse for the bit.

Let us now trace through a typical illustrative analog voltage magnitude of 8.5 volts. When the input gate 45 is opened for the first bit the 8.5 volt analog signal passes through the amplifier 50 to the subtractor 60 and the comparator 70 as was explained previously. Since the analog voltage of 8.5 volts is greater than the reference voltage 75 which was chosen as 5 volts, the comparator 70 provides an output pulse which opens the subtractor gate 65, causing the subtractor 60 to subtract the reference voltage of 5 volts from the analog signal voltage of 8.5 volts, thereby applying a difference voltage of 3.5 volts to the multiplying amplifier 85. The multiplying amplifier 85 then multiplies by 2 this input voltage of 3.5 volts, providing 7.0 volts at its output which then passes through the gate A to store on the capacitor B this voltage of 7.0 volts. When the gate A closes the capacitor B remains charged at this value of 7.0 volts.

When the first blocking oscillator pulse occurs corresponding to the second bit the gates A′ and C will open causing the 7.0 volts on the capacitor B to be passed through the gate C and applied to the input of the amplifier 50 so as to be recirculated through the system. Since the voltage of 7.0 volts which then appears at the input of the comparator 70 is still greater than the reference voltage of 5 volts, the comparator 70 again produces an output pulse which opens the subtractor gate 65, causing the subtractor 60 to subtract the reference voltage of 5 volts from the applied input voltage of 7.0 volts to give a difference voltage of 2 volts applied to the multiplying amplifer 85. At the output of the multiplying amplifier a voltage of twice 2 or 4 volts is now obtained which passes through the now open gate A′ (the gate A being closed) to store on the capacitor B′ this voltage of 4 volts.

On the second blocking oscillator pulse corresponding to the third bit, the gates A and C′ are opened, causing the 4 volts on the capacitor B′ to the applied to the input of the subtractor 60 and the comparator 70 through the amplifier 50. Since the voltage of 4 volts applied to the comparator 70 is now less the reference voltage of 5 volts, the comparator 70 produces no output pulse and the 4 volt signal applied to the input of the subtractor 60 passes to the multiplying amplifier 85 substantially unchanged. The multiplying amplifier 85 therefore multiplies this 4 volt magnitude to give 8 volts which passes through the now open gate A to be stored on the capacitor B. The above described operation continues in a like manner until all eight bits have been obtained.

The table following summarizes the entire eight-bit operation of the system. The voltage $V_{in}$ refers to the voltage applied to the subtractor 60 and the comparator 70 for each bit, the voltage $V_1$ refers to the voltage at the output of the subtractor 60 which is applied to the multiplying amplifier 85, and the voltage $V_c$ refers to the voltage at the output of the multiplying amplifier 85 which is stored either by the capacitor B or B′. For each bit, the binary digit column receives a 1 if a pulse is obtained from the comparator 70, and a 0 if no pulse is obtained.

| Bit No. | $V_{in}$ | $V_1$ | $V_e$ | Binary Digit ($P_n$) |
|---|---|---|---|---|
| 1 | 8.5 | 3.5 | 7.0 | 1 |
| 2 | 7.0 | 2.0 | 4.0 | 1 |
| 3 | 4.0 | 4.0 | 8.0 | 0 |
| 4 | 8.0 | 3.0 | 6.0 | 1 |
| 5 | 6.0 | 1.0 | 2.0 | 1 |
| 6 | 2.0 | 2.0 | 4.0 | 0 |
| 7 | 4.0 | 4.0 | 8.0 | 0 |
| 8 | 8.0 | 3.0 | 6.0 | 1 |

Now using the values in the binary digit column of the above table, we get the 8-digit binary number 11011001 representing the input analog signal V. The previously given equation now gives us the magnitude of the input analog signal V as follows:

$$V=R\sum_{n=1}^{n=8}\frac{1}{2^n}P_n$$

$$V=10\left[\frac{1}{2}(1)+\frac{1}{4}(1)+\frac{1}{8}(0)+\frac{1}{16}(1)+\frac{1}{32}(1)+\frac{1}{64}(0)+\frac{1}{128}(0)+\frac{1}{256}(1)\right]$$

$$V=10\left[\frac{1}{2}+\frac{1}{4}+0+\frac{1}{16}+\frac{1}{32}+0+0+\frac{1}{256}\right]=10\frac{217}{256}=8.46 \text{ volts}$$

It is to be understood in connection with the present invention that the graphs of FIGS. 2 and 3 and the specific examples given in explaining the detailed operation of the system are presented only for illustrative purposes and in no way are intended to limit the scope of this invention.

It is also to be understood that various modifications and variations can be made in the embodiment of the invention shown in FIG. 1 and the system can be operated in a variety of ways without departing from the scope of this invention. For example, as previously mentioned, it is not necessary that the multiplying amplifier 85 multiply by 2 if the obtaining of a binary pulse representation is not important. In fact, if the multiplying amplifier 85 is adjusted to multiply by a factor of less than 1, such as 0.5, operation of the system can still be obtained by choosing the reference voltage 75 to be of opposite sign. Thus, in the previous example, if the multiplying amplifier 85 multiplies by 0.5, the reference voltage 75 would be chosen equal to −5 volts and the comparator 70 would be adapted to produce an output pulse when the analog signal is less than 5 volts. The previously described operation of the invention is intended to include this type of operation. Other variations in the embodiment of FIG. 1 are possible, such as the use of different types and arrangements of electronic devices which produce the same circuit operation as provided by the embodiment described.

The above examples are only illustrative and are not to be considered exhaustive. The present invention, therefore, is to be considered as including all possible modifications and variations which can be made within the scope of the invention as defined in the appended claims.

I claim as my invention:

1. An analog to digital conversion system comprising in combination: a first means to which the analog signal to be digitized is fed, said first means for subtracting a fixed magnitude signal from said analog signal when the analog signal is greater than a predetermined magnitude and for passing the analog signal without subtraction when said analog signal is equal and less than said predetermined magnitude, a second means to which the output of said first means is fed, said second means adapted to multiply the output signal from said first means by a predetermined multiplying factor, a first and second signal storage means each having an input and output connection, a first gate means connected between the output of said second means and the input connection of said first storage means, a second gate means connected between the output of said second means and the input connection of said second storage means, a third gate means connected between said first storage means and the input of said first means, a fourth gate means connected between the output connection of said second storage means and the input to said first means, an input gate means between said analog signal and the input of said first means, circuit means connected to said first, second, third, and fourth gate means for driving said gates so that the multiplied output from said second means connected to said input of said first and second gate means is alternately stored in each of said first and second storage means, said analog signal is disconnected from said first means and the signal stored on each respective storage means is recirculated through said system a predetermined number of times after said analog signal is disconnected, and means connected to said first means for generating a pulse each time said first means performs a subtraction operation, the pulses thereby generated being a digital representation of said analog signal.

2. An analog to digital conversion system comprising in combination: a first means to which the analog signal to be digitized is fed, said first means subtracting a fixed magnitude signal from said analog signal when the analog signal is greater than said fixed magnitude and pass the analog signal without subtraction when said analog signal is equal and less than a predetermined magnitude, a second means to which the output of said first means is fed, said second means adapted to multiply the output signal from said first means by a predetermined multiplying factor, a first and second signal storage means each having an input and output connection, a first gate means connected between the output of said second means and the input connection of said first storage means, a second gate means connected between the output of said second means and the input connection of said second storage means, a third gate means connected between said first storage means and the input of said first means, a fourth gate means connected between the output connection of said second storage means and the input to said first means, an input gate means between said analog signal and the input of said first means, circuit means connected to said first, second, third, and fourth gate means for driving said gates so that the multiplied output from said second means connected to said input of said first and second gate means is alternately stored in each of said first and second storage means, said analog signal is disconnected from said first means and the signal stored on each respective storage means is recirculated through said system a predetermined number of times after said analog signal is disconnected, and means connected to said first means for generating a pulse each time said first means performs a subtraction operation, the pulses thereby generated being a digital representation of said analog signal.

3. An analog-to-digital conversion system comprising in combination: an input gate to which the analog signal to be digitized is fed, a buffer amplifier to which the output of said input gate is fed, a subtractor connected to the output of said amplifier, a comparator also connected to the output of said amplifier, said comparator adapted to produce an output pulse when said analog signal is greater than a predetermined magnitude, a gate connected between said comparator and said subtractor for causing the production of said output pulse by said comparator to modify the operation of said subtractor, said subtractor being constructed and arranged so that it subtracts a fixed magnitude signal from the signal output of said amplifier when the amplifier signal is greater than said fixed magnitude signal and passes the amplifier signal through essentially unchanged when no comparator pulse is produced, a multiplying amplifier to which the output of said subtractor is fed, first and second signal storage means each having an input and output connection, first and second gates connected between the output of said multiplying amplifier and the input connection of said first and second storage means respectively, third and fourth gates connected between the output connection of said first and second storage means respectively and the input of said buffer amplifier, circuit means for driving said first, second, third and fourth gates so that the multiplied output from said multiplying amplifier is alternately stored on each of said first and second storage means connected thereto through said first and second gates, said analog signal is disconnected from said buffer amplifier, and the signal stored on each respective storage means is recirculated through said system a predetermined number of times after said analog system is disconnected, and means connected to said comparator for extracting therefrom the pulses generated each time the output signal from said buffer amplifier is greater than said fixed magnitude signal, said pulses serving as a digital representation of said analog signal.

4. The invention in accordance with claim 3 wherein said multiplying amplifier multiplies by a multiplying factor of substantially two so that the digital representation is obtained in binary form.

5. Apparatus for converting an analog signal to a digital signal comprising a reference voltage source for generating a signal of a predetermined magnitude, a gate having an input for receiving a signal to be gated and another input for receiving the signal to be gated and another input for receiving a gating signal and an output, means operatively connected to the output of said gating means for generating a pulse when the output of said gate exceeds the magnitude of the signal established by said reference voltage, a multiplying amplifier, means for connecting the output of said gate to said amplifier, said connecting means having a control terminal and being adapted to cause subtraction of a signal whose magnitude is equal to that generated by the reference voltage from the gate output when the control terminal is pulsed, means for connecting said pulse generating means to said control terminal, means for storing the output of said amplifier, said storing means includes a first input gate, a first storage capacitor, a first output gate in series connection; a second input gate, a second storage capacitor, and a second output gate in series connection; means for sequentially opening both said first input gate and second output gate, and then said second input gate and first output gate, means for connecting said storing means to one input of said gate and means connecting the analog signal to the other input of said gate.

References Cited by the Examiner

UNITED STATES PATENTS 2,969,535 1/61 Foulkes ............ 235—154 X

OTHER REFERENCES

Richards: "Digital Computer Components and Circuits," published by D. Van Nostrand Co., 1957.

MALCOLM A. MORRISON, *Primary Examiner.*

CORNELIUS D. ANGEL, *Examiner.*